United States Patent
Muraguchi (10) Patent No.: US 11,031,928 B2
(45) Date of Patent: Jun. 8, 2021

(54) SEMICONDUCTOR INTEGRATED CIRCUIT AND TRANSMISSION DEVICE

(71) Applicant: Toshiba Memory Corporation, Tokyo (JP)

(72) Inventor: Takanobu Muraguchi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,016

(22) Filed: Aug. 30, 2019

(65) Prior Publication Data
US 2020/0304116 A1 Sep. 24, 2020

(30) Foreign Application Priority Data

Mar. 18, 2019 (JP) .............................. JP2019-050386

(51) Int. Cl.
*H03K 5/15* (2006.01)
*H03K 7/08* (2006.01)

(52) U.S. Cl.
CPC ............. *H03K 5/1504* (2013.01); *H03K 7/08* (2013.01)

(58) Field of Classification Search
CPC ........ G11C 27/00; G11C 27/04; H03H 11/00; H03H 11/265; H03K 5/00; H03K 5/06; H03K 5/13; H03K 5/132; H03K 5/1504; H03K 7/00; H03K 7/08
USPC ....................................................... 327/284
See application file for complete search history.

(56) References Cited

U.S. PATENT DOCUMENTS

| 7,154,978 | B2 | 12/2006 | Juan et al. |
| 7,728,444 | B2 | 6/2010 | Hayashi |
| 2003/0099321 | A1* | 5/2003 | Juan .......................... H03L 7/07 375/376 |
| 2005/0111602 | A1* | 5/2005 | Suda ..................... H04L 7/0037 375/355 |
| 2013/0229216 | A1* | 9/2013 | Wu ....................... H03K 5/1565 327/175 |

FOREIGN PATENT DOCUMENTS

| JP | H08-012574 B2 | 2/1996 |
| JP | 2001-264390 A | 9/2001 |
| JP | 5493776 B2 | 5/2014 |

* cited by examiner

*Primary Examiner* — Lincoln D Donovan
*Assistant Examiner* — Dave Mattison
(74) *Attorney, Agent, or Firm* — Kim & Stewart LLP (57) ABSTRACT

A semiconductor integrated circuit includes a first signal transmission path and a second signal transmission path in parallel with each other, a first variable delay circuit provided on the first signal transmission path and configured to cause a first signal to be delayed by a first delay amount, a duty adjustment circuit provided on the first signal transmission path in series with the first variable delay circuit, and a second variable delay circuit provided on the second signal transmission path and configured to cause a second signal to be delayed by a second delay amount. The first delay amount is smaller than the second delay amount by a third delay amount corresponding to an amount of delay applied to the first signal by the duty adjustment circuit.

19 Claims, 5 Drawing Sheets

SEMICONDUCTOR INTEGRATED CIRCUIT AND TRANSMISSION DEVICE

CROSS-REFERENCE TO RELATED APPLICATION

This application is based upon and claims the benefit of priority from Japanese Patent Application No. 2019-050386, filed Mar. 18, 2019, the entire contents of which are incorporated herein by reference.

FIELD

Embodiments described herein relate generally to a semiconductor integrated circuit and a transmission device.

BACKGROUND

In a semiconductor integrated circuit in which a plurality of parallel delay paths are provided, different types of signals may be transferred along the plurality of delay paths. It is desirable that the delay amounts of the plurality of parallel delay paths be adjusted appropriately according to different signal types.

DETAILED DESCRIPTION

In general, according to an embodiment, a semiconductor integrated circuit includes a first signal transmission path and a second signal transmission path in parallel with each other, a first variable delay circuit provided on the first signal transmission path and configured to cause a first signal to be delayed by a first delay amount, a duty adjustment circuit provided on the first signal transmission path in series with the first variable delay circuit, and a second variable delay circuit provided on the second signal transmission path and configured to cause a second signal to be delayed by a second delay amount. The first delay amount is smaller than the second delay amount by a third delay amount corresponding to an amount of delay applied to the first signal by the duty adjustment circuit.

Hereinafter, a semiconductor integrated circuit according to an example embodiment will be described with reference to the accompanying drawings. Furthermore, this example embodiment is not intended to limit the present disclosure.

Embodiment

Figure 1:
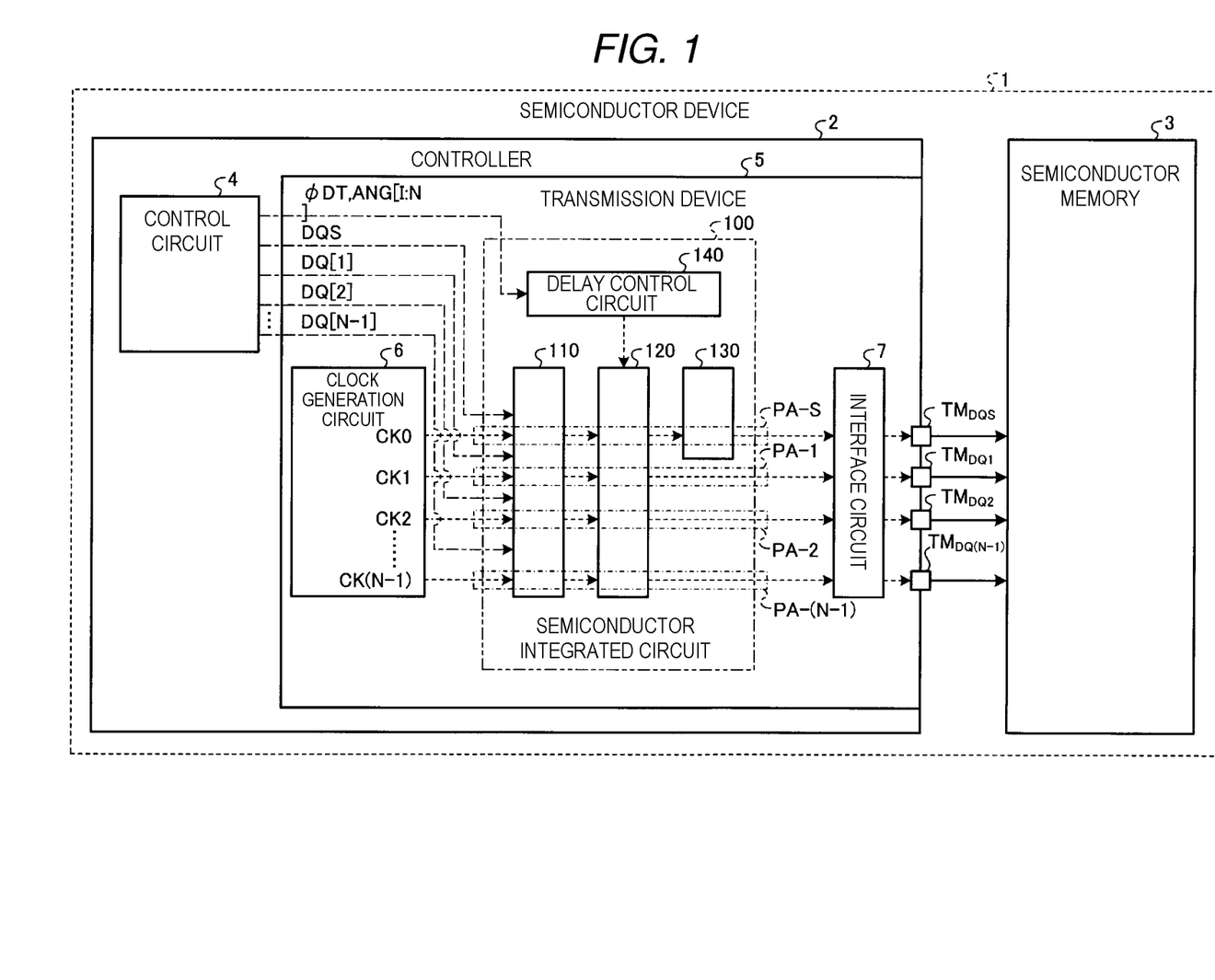
FIG. 1 is a diagram illustrating a configuration of a semiconductor device including a semiconductor integrated circuit according to an embodiment.

A semiconductor integrated circuit according to one embodiment may be used as a parallel interface for a semiconductor memory. For example, a semiconductor integrated circuit 100 is provided in the semiconductor device 1 illustrated in FIG. 1. FIG. 1 is a diagram illustrating a configuration of the semiconductor device 1 including the semiconductor integrated circuit 100. For example, the semiconductor device 1 includes a controller 2 and a semiconductor memory 3. The controller 2 includes a control circuit 4 and a transmission device 5. The transmission device 5 is electrically connected to the semiconductor memory 3 via terminals $TM_{DQS}$, $TM_{DQ1}$, $TM_{DQ2}$, ..., and $TM_{DQ(N-1)}$, and is able to transmit a plurality of signals to the semiconductor memory 3 via these terminals $TM_{DQS}$, $TM_{DQ1}$, $TM_{DQ2}$, ..., and $TM_{DQ(N-1)}$. The transmission device 5 includes a clock generation circuit 6, an interface circuit 7, and the semiconductor integrated circuit 100, which serves as a parallel interface between the clock generation circuit 6 and the interface circuit 7. Upon receiving a plurality of signals from the semiconductor integrated circuit 100, the interface circuit 7 is able to transmit the plurality of signals to the semiconductor memory 3 via the terminals $TM_{DQS}$, $TM_{DQ1}$, $TM_{DQ2}$ ... and $TM_{DQ(N-1)}$.

When used as a parallel interface, the semiconductor integrated circuit 100 has a configuration in which a plurality of delay paths PA-S, PA-1, PA-2, ..., and PA-(N−1) between the clock generation circuit 6 and the interface circuit 7 are provided. These delay paths are provided in parallel to one another. In this context, N is any integer of 3 or more. Different types of signals may be transferred through the plurality of delay paths PA-S to PA-(N−1).

In the semiconductor memory 3, such as a NAND-type flash memory, which performs an operation synchronized to a clock signal (also referred to as strobe signal), a clock signal phase-controlled with respect to data is needed. Therefore, the control circuit 4 previously adjusts a phase relationship between a strobe signal DQS and (N−1) bits of data DQ[1] to DQ[N−1], and then supplies the strobe signal DQS and pieces of data DQ[1] to DQ[N−1], as adjusted in phase relationship, to the semiconductor integrated circuit 100. To transmit the strobe signal DQS and pieces of data DQ[1] to DQ[N−1] while maintaining the phase relationship therebetween, the semiconductor integrated circuit 100 performs bit slicing with use of reference clock signals CK0 to CK(N−1). Bit slicing is processing of converting to binary data for data of respective path of parallel data (such as the strobe signal DQS and pieces of data DQ[1] to DQ[N−1]) on a bit-by-bit basis in synchronization with the reference clock signals CK0 to CK(N−1). Therefore, it is desirable that amounts of delay of the plurality of delay paths PA-S to PA-(N−1) would be adjusted appropriately with respect to each other (for example, in such a way as to be approximately equal or within sufficient margins) and the parallel data would be transmitted to the interface circuit 7 while the appropriate phase relationship thereof is maintained.

However, among the plurality of delay paths PA-S to PA-(N−1), the delay path PA-S, which is a delay path for the strobe signal DQS, has a possibility of having a larger amount of delay than those of the delay paths PA-1 to PA-(N−1) for the pieces of data DQ[1] to DQ[N−1]. For example, the semiconductor integrated circuit 100 includes a flip-flop circuit group 110, a variable delay circuit group 120, and a duty adjustment circuit 130. The delay path PA-S goes through the flip-flop circuit group 110, the variable delay circuit group 120, and the duty adjustment circuit 130. The delay paths PA-1 to PA-(N−1) go through flip-flop circuits 111 in the flip-flop circuit group 110 and variable delay circuits 121 in the variable delay circuit group 120, but not through the duty adjustment circuit 130 (see FIG. 2). Therefore, the delay path PA-S has the possibility of having a larger amount of delay than those of the other delay paths PA-1 to PA-(N−1) due to an amount of delay corresponding to characteristics of the duty adjustment circuit 130.

Figure 2:
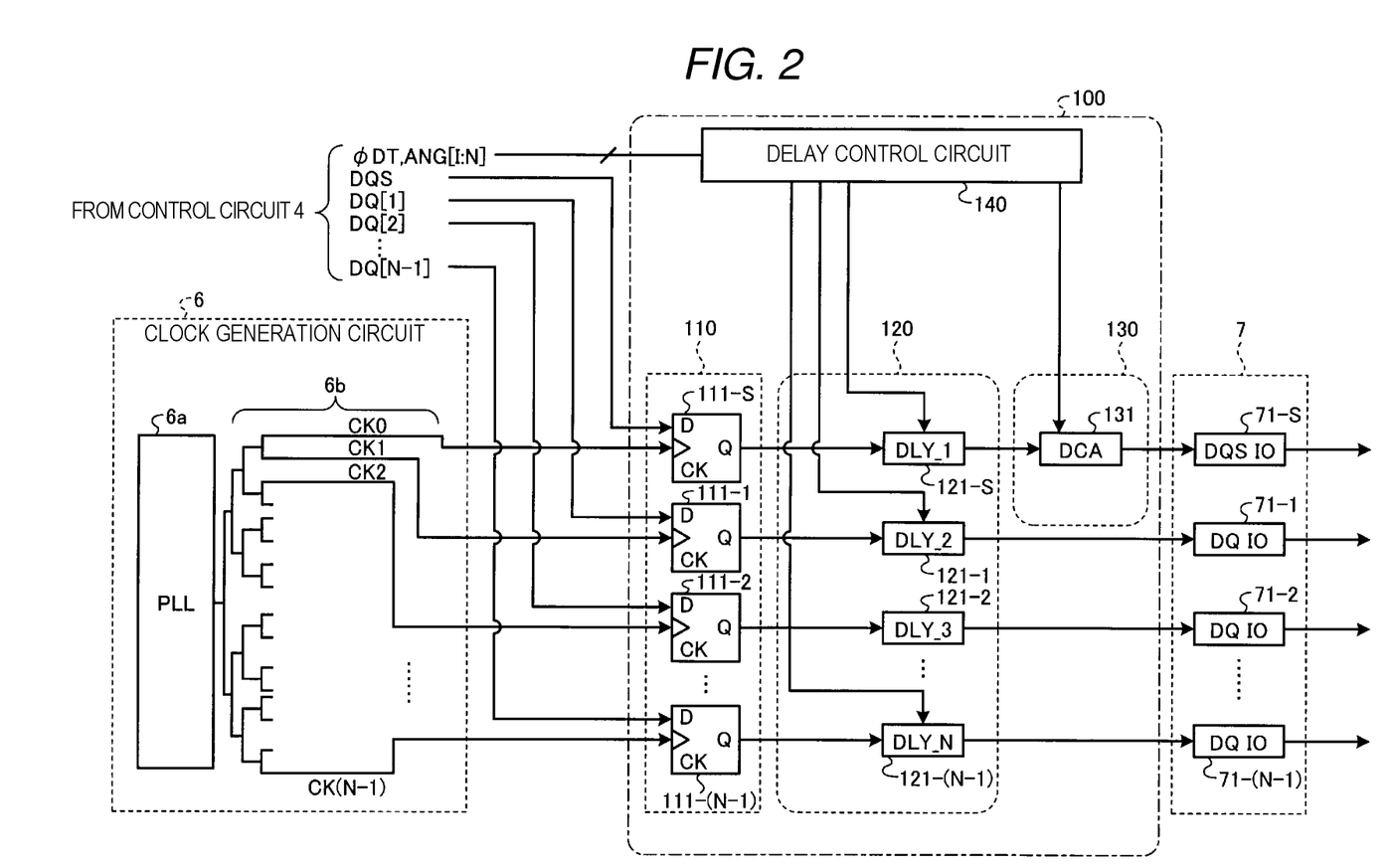
FIG. 2 is a diagram illustrating a configuration of a semiconductor integrated circuit according to an embodiment.

In light of such, it might be considered that a dummy duty adjustment circuit (a duty adjustment circuit serving as a mirror of the duty adjustment circuit 130) could be provided between the variable delay circuit group 120 for the other delay paths PA-1 to PA-(N−1) and the interface circuit 7. However, in such a case, the circuit size of the semiconductor integrated circuit 100 increases, so that the cost of the semiconductor integrated circuit 100 may also increase.

In the semiconductor integrated circuit 100, the present embodiment equalizes the amounts of delay of a plurality of delay paths PA-S to PA-(N−1) by adjusting the amount of delay of the variable delay circuit 121 provided in the delay path PA-S to be smaller than the amounts of delay of the variable delay circuits 121 provided in the other delay paths PA-1 to PA-(N−1).

Specifically, the semiconductor integrated circuit 100 is configured as illustrated in FIG. 2. FIG. 2 is a diagram illustrating a configuration of the semiconductor integrated circuit 100.

The semiconductor integrated circuit 100 includes, in addition to the flip-flop circuit group 110, the variable delay circuit group 120, and the duty adjustment circuit 130, a delay control circuit 140, which adjusts the amounts of delay of the variable delay circuit group 120.

The flip-flop circuit group 110 includes a plurality of flip-flop circuits 111-S, 111-1, 111-2, . . . , and 111-(N−1). The flip-flop circuits 111-S, 111-1, 111-2, . . . , and 111-(N−1) are provided on the delay paths PA-S, PA-1, PA-2, . . . , and PA-(N−1), respectively.

The flip-flop circuit 111-S stores a strobe signal DQS, which is supplied from the control circuit 4 to a data terminal D, in synchronization with a clock signal CK0, which is supplied to a clock terminal CK, and then outputs the stored strobe signal DQS from an output terminal Q. The flip-flop circuit 111-1 stores data DQ[1], which is supplied from the control circuit 4 to a data terminal D, in synchronization with a clock signal CK1, which is supplied to a clock terminal CK, and then outputs the stored data DQ[1] from an output terminal Q. The flip-flop circuit 111-2 stores data DQ[2], which is supplied from the control circuit 4 to a data terminal D, in synchronization with a clock signal CK2, which is supplied to a clock terminal CK, and then outputs the stored data DQ[2] from an output terminal Q. Similarly, the flip-flop circuit 111-(N−1) stores data DQ[N−1], which is supplied from the control circuit 4 to a data terminal D, in synchronization with a clock signal CK(N−1), which is supplied to a clock terminal CK, and then outputs the stored data DQ[N−1] from an output terminal Q.

Furthermore, the clock generation circuit 6 includes a phase-locked loop (PLL) circuit 6a and a clock tree circuit 6b. The PLL circuit 6a generates a plurality of clock signals CK0, CK1, . . . , and CK (N−1), and supplies the plurality of clock signals CK0, CK1, . . . , and CK(N−1) to the clock tree circuit 6b. The clock tree circuit 6b distributes the plurality of clock signals CK0, CK1, . . . , and CK(N−1) to the plurality of flip-flop circuits 111-S, 111-1, 111-2, . . . , and 111-(N−1) in a branched manner. This enables the clock generation circuit 6 to supply the plurality of clock signals CK0, CK1, . . . , and CK(N−1) synchronized with each other to the plurality of flip-flop circuits 111-S, 111-1, 111-2, . . . , and 111-(N−1).

The variable delay circuit group 120 includes a plurality of variable delay circuits 121-S, 121-1, 121-2, . . . , and 121-(N−1). The variable delay circuits 121-S, 121-1, 121-2, . . . , and 121-(N−1) may also be referred to as "delay elements DLY_1, DLY_2, DLY_3, . . . , and DLY_N". The variable delay circuits 121-S, 121-1, 121-2, . . . , and 121-(N−1) are provided on the delay paths PA-S, PA-1, PA-2, . . . , and PA-(N−1), respectively.

The variable delay circuit 121-S applies the amount of delay D_S=a predetermined amount of delay D×n[S] (n[S] ≤p and n[S] being any integer more than or equal to 1) to the strobe signal DQS supplied from the flip-flop circuit 111-S, and then outputs the strobe signal DQS with the amount of delay D_S applied thereto. The variable delay circuit 121-1 applies the amount of delay D_1=the predetermined amount of delay D×n[1] (n[1]≤p) to the data DQ[1] supplied from the flip-flop circuit 111-1, and then outputs the data DQ[1] with the amount of delay D_1 applied thereto. The variable delay circuit 121-2 applies the amount of delay D_2=the predetermined amount of delay D×n[2] (n[2] p) to the data DQ[2] supplied from the flip-flop circuit 111-2, and then outputs the data DQ[2] with the amount of delay D_2 applied thereto. Similarly, the variable delay circuit 121-(N−1) applies the amount of delay D (N−1)=the predetermined amount of delay D×n[N−1] (n[N−1] p) to the data DQ[N−1] supplied from the flip-flop circuit 111-(N−1), and then outputs the data DQ[N−1] with the amount of delay D×n[N−1] applied thereto.

Figure 3:
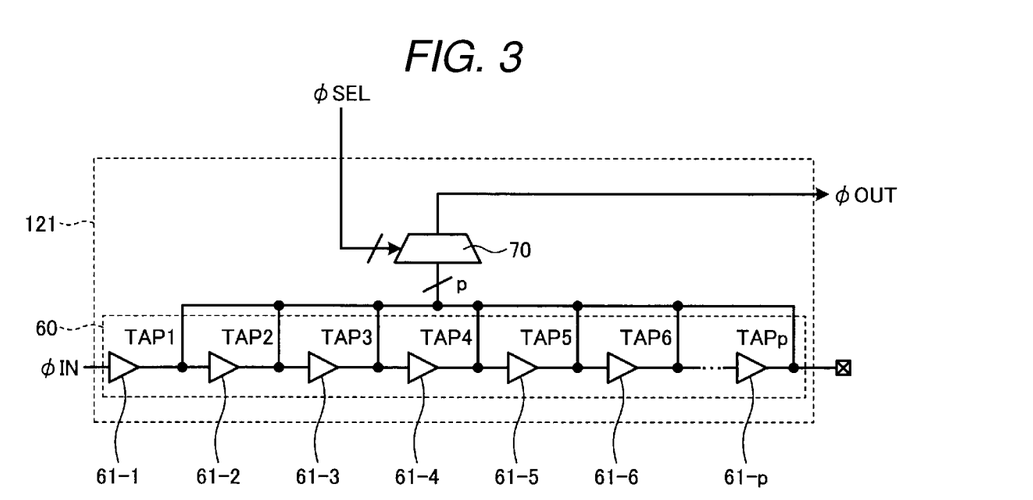
FIG. 3 is a diagram illustrating a configuration of a variable delay circuit according to an embodiment.

In the respective variable delay circuits 121-S, 121-1, 121-2, . . . , and 121-(N−1), as illustrated in FIG. 3, the amount of delay D×n[S], D×n[1], D×n[2], . . . , and D×n[N−1], respectively applied, are configured to be varied by control signals output from the delay control circuit 140. The variable delay circuits 121-S, 121-1, 121-2, . . . , and 121-(N−1) have similar configurations and are, therefore, represented as a variable delay circuit 121 in FIG. 3. FIG. 3 is a diagram illustrating a configuration of the variable delay circuit 121.

The variable delay circuit 121 includes a delay chain 60 and a selector 70. The delay chain 60 has a configuration in which a plurality of delay elements 61-1 to 61-$p$ ($p$ being any integer more than or equal to 2) is connected in series. The delay elements 61-1 to 61-$p$ have mutually equivalent delay characteristics (for example, equal amounts of delay D).

The delay elements 61-1 to 61-$p$ in the delay chain 60 output, to the selector 70, tap outputs TAP1 to TAPp obtained by delaying an input signal φIN according to the number of delay elements from an input node from which the input signal φIN is input. For example, the delay element 61-$k$, which is the k-th delay element from the input node (k being any integer more than or equal to 1 and less than or equal to p), outputs, to the selector 70, a tap output TAPk obtained by delaying the input signal φIN with the amount of delay D×k.

The selector 70 selects one of a plurality of tap outputs TAP1 to TAPp output from the plurality of delay elements 61-1 to 61-$p$ according to a select signal φSEL supplied from the delay control circuit 140, and then outputs an output signal φφUT having a desired amount of delay $D_{total}$.

Here, the select signal φSEL can be set as a signal indicating the number of taps corresponding to the amount of delay. More specifically, the select signals can be set as φSEL=n[S], n[1], n[2], . . . , and n[N−1] with respect to the amounts of delay D×n[S], D×n[1], D×n[2], . . . , and D×n[N−1], respectively, which are applied to the respective variable delay circuits 121-S, 121-1, 121-2, and 121-(N−1).

Referring back to FIG. 2, the duty adjustment circuit 130 includes a duty cycle adjuster (DCA) 131. The DCA 131 is provided on the delay path PA-S.

Figure 4:
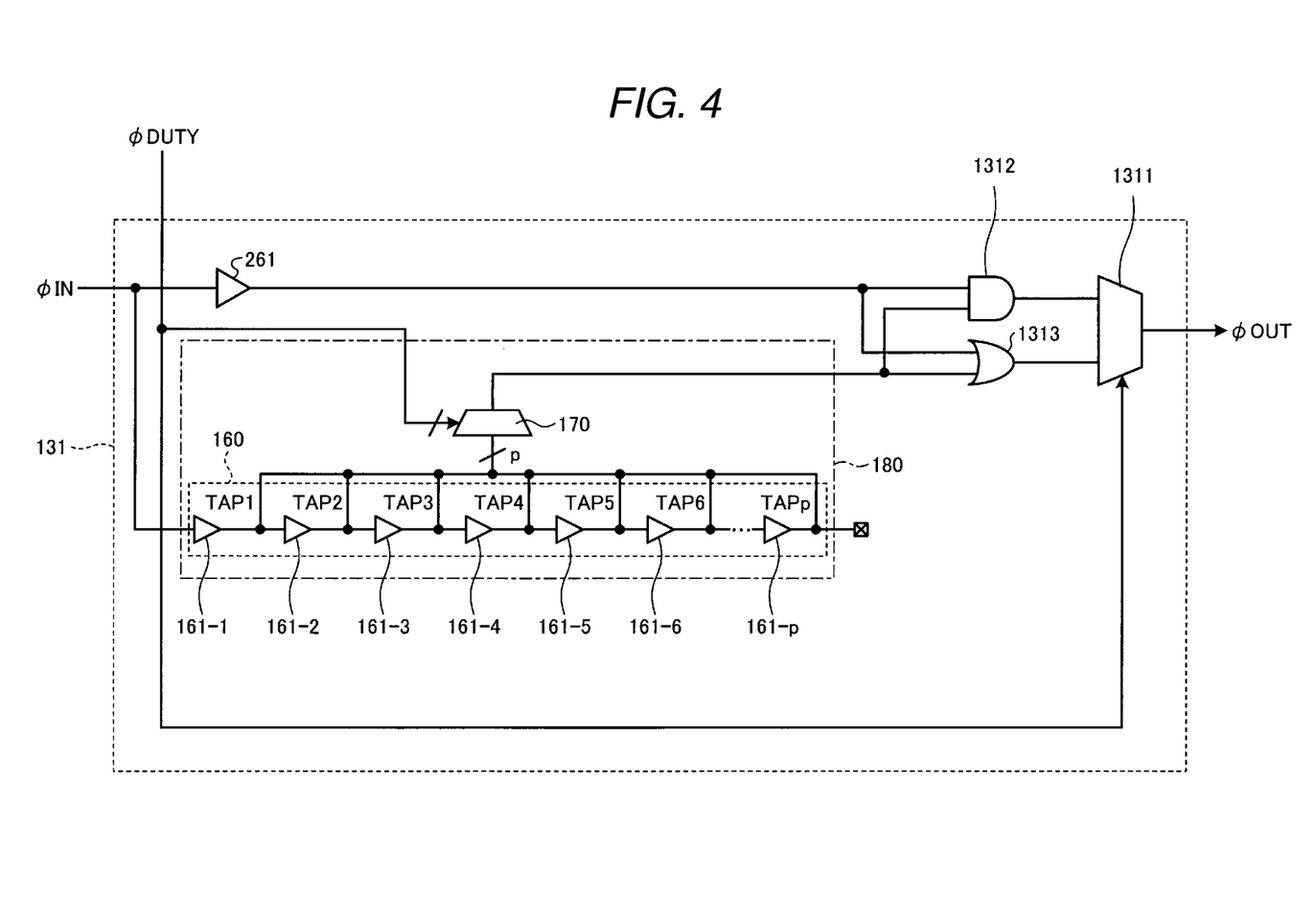
FIG. 4 is a diagram illustrating a configuration of a duty adjustment circuit according to an embodiment.

The DCA 131 makes adjustment of duty ratio to the strobe signal DQS supplied from the variable delay circuit 121-S, and then outputs the strobe signal DQS subjected to adjustment. In the DCA 131, as illustrated in FIG. 4, the amount of adjustment of duty ratio is configured to be varied by a select signal ϕDUTY output from the delay control circuit 140. FIG. 4 is a diagram illustrating a configuration of the DCA 131 in the duty adjustment circuit 130.

The DCA 131 includes a delay chain 160, a selector 170, a delay element 261, a selector 1311, an AND gate 1312, and an OR gate 1313. The delay chain 160 has a configuration in which a plurality of delay elements 161-1 to 161-$p$ is connected in series. The delay elements 161-1 to 161-$p$ have mutually equivalent delay characteristics (for example, equal amounts of delay D) and have delay characteristics equivalent to those of the respective delay elements 61-1 to 61-$p$ (see FIG. 3) of each variable delay circuit 121 (for example, equal amounts of delay D). Thus, a delay block 180 including the delay chain 160 and the selector 170 has a circuit configuration equivalent to the variable delay circuit 121 (see FIG. 3).

The delay element 261 has a delay characteristic equivalent to each of the delay elements 161-1 to 161-$p$ (an equal amount of delay D) and has a delay characteristic equivalent to each of the delay elements 61-1 to 61-$p$ (see FIG. 3) (an equal amount of delay D). The amount of delay which is applied by the delay element 261 (for example, the amount of delay D) corresponds to the minimum amount of delay in the DCA 131.

The select signal ϕDUTY is supplied to each of the selector 170 and the selector 1311. The AND gate 1312 calculates a logical product between a signal obtained by the delay element 261 applying the amount of delay D to the input signal ϕIN and an output of the delay block 180, and outputs a result of the calculation to the selector 1311. The OR gate 1313 calculates a logical sum between a signal obtained by the delay element 261 applying the amount of delay D to the input signal ϕIN and an output of the delay block 180, and outputs a result of the calculation to the selector 1311.

According to the select signal ϕDUTY supplied from the delay control circuit 140, the selector 1311 selects a result of the calculation performed by the AND gate 1312 when the rising edge of the input signal ϕIN is to be selectively delayed for duty ratio adjustment, and selects a result of the calculation performed by the OR gate 1313 when the falling edge of the input signal ϕIN is to be selectively delayed for duty ratio adjustment.

Referring back to FIG. 2, the delay control circuit 140 adjusts the amount of delay D×n[S] of the variable delay circuit 121-S provided in the delay path PA-S to be smaller than the amounts of delay D×n[1], D×n[2], . . . , and D×n[N−1] of the variable delay circuits 121-1 to 121-(N−1) provided in the other delay paths PA-1 to PA-(N−1).

The delay control circuit 140 adjusts the amount of delay D×n[S] to be smaller than the amounts of delay D×n[1], D×n[2], and D×n[N−1] with the amount of delay corresponding to the characteristic of the DCA 131 (for example, the minimum amount of delay D of the DCA 131). For example, when performing adjustment to D×n[1]=D×n[2]= . . . =D×n[N−1]=D×m (m being any integer more than or equal to 2), the delay control circuit 140 can perform adjustment to D×n[S]=D×(m−1). This enables making the amounts of delay of a plurality of delay paths PA-S to PA-(N−1) approximately equal.

Furthermore, in a case where there is a variation between predetermined amounts of delay D which are applied by the respective variable delay circuits 121-S, 121-1, 121-2, . . . , and 121-(N−1), the delay control circuit 140 can perform calibration in such a manner that the amounts of delay for the delay paths PA-S to PA-(N−1) become equal. In this case, the delay control circuit 140 is able to store the numbers of delay stages n[1], n[2], . . . , and n[N−1] set in the respective variable delay circuits 121-S, 121-1, 121-2, . . . , and 121-(N−1), as criteria for equalizing delays for the respective delay paths PA-S to PA-(N−1).

Figure 5:
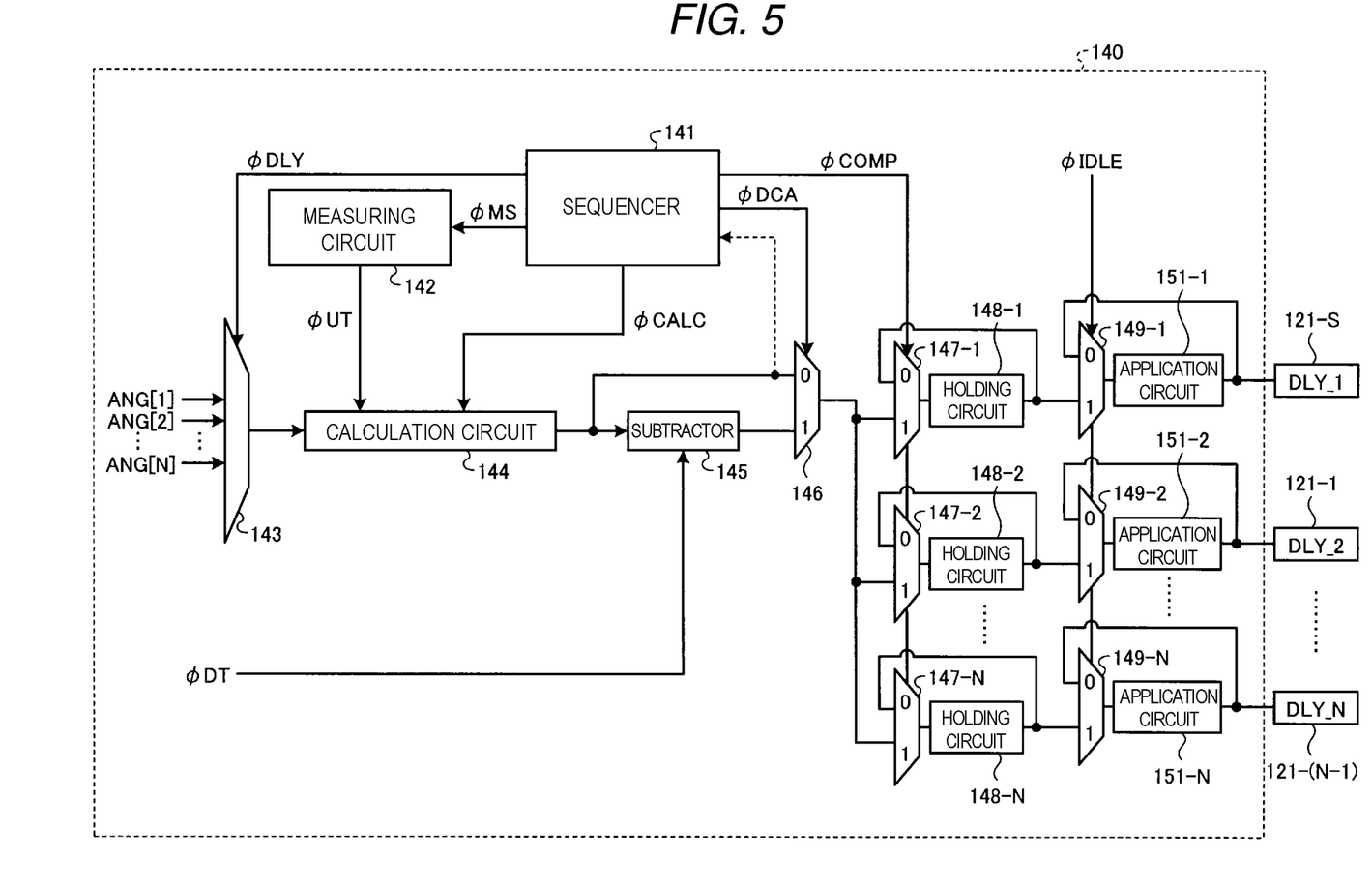
FIG. 5 is a diagram illustrating a configuration of a delay control circuit according to an embodiment.

The configuration of the delay control circuit 140 for controlling the variable delay circuits 121-S to 121-(N−1) may be, for example, a configuration illustrated in FIG. 5. FIG. 5 is a diagram illustrating a part of the configuration of the delay control circuit 140. Furthermore, a portion of the delay control circuit 140 for controlling the duty adjustment circuit 130 is omitted in FIG. 5 for illustration purposes.

The delay control circuit 140 includes a sequencer 141, a measuring circuit 142, a selector 143, a calculation circuit 144, a subtractor 145, a selector 146, selectors 147-1 to 147-N, holding circuits 148-1 to 148-N, selectors 149-1 to 149-N, and application circuits 151-1 to 151-N.

The sequencer 141 comprehensively controls various units of the delay control circuit 140. For example, the sequencer 141 supplies a control signal ϕMS to the measuring circuit 142. In response to the control signal ϕMS becoming at active level, the measuring circuit 142 determines an instruction for calculating the number of taps per unit amount of angle delay being received and thus starts such a calculation. The measuring circuit 142, which includes a ring oscillator, generates a unit number-of-taps signal ϕUT, which indicates the number of taps per unit amount of angle delay, and then supplies the unit number-of-taps signal ϕUT to the calculation circuit 144. Furthermore, the measuring circuit 142 may also be, instead of the ring oscillator, a circuit which obtains the number of taps for 360 degrees with use of a delay element having a length exceeding one period, a phase comparator, and a phase comparison sequencer.

The selector 143 receives, from the control circuit 4 (see FIG. 1), the amounts of angle delay ANG[1] to ANG[N], which are directed to the respective variable delay circuits 121-S to 121-(N−1). The sequencer 141 selects a variable delay circuit 121 targeted for calculation of the amount of delay to be set, and supplies a select signal ϕDLY indicating the selected variable delay circuit 121 to a control terminal of the selector 143. The selector 143 selects the amount of angle delay ANG corresponding to the variable delay circuit 121 indicated by the select signal ϕDLY, and then outputs the selected amount of angle delay ANG to the calculation circuit 144.

For example, in the case of the select signal ϕDLY=1, the selector 143 determines the variable delay circuit 121-S being selected, and thus selects the amount of angle delay ANG[1] and then outputs the selected amount of angle delay ANG[1] to the calculation circuit 144. For example, in the case of the select signal ϕDLY=2, the selector 143 determines the variable delay circuit 121-1 being selected, and thus selects the amount of angle delay ANG[2] and then outputs the selected amount of angle delay ANG[2] to the calculation circuit 144.

The sequencer 141 supplies a control signal ϕCALC to the calculation circuit 144. In response to the control signal ϕCALC becoming at active level, the calculation circuit 144 determines an instruction for calculating the number of taps equivalent to the amount of angle delay supplied from the selector 143 and thus starts such a calculation. More specifically, the calculation circuit 144 obtains the number of taps corresponding to the amount of angle delay ANG by multiplying the amount of angle delay ANG supplied from the selector 143 by the unit number of taps indicated by the unit number-of-taps signal ϕUT supplied from the measuring circuit 142. The calculation circuit 144 supplies the calculated number of taps to the subtractor 145 and the selector 146.

The subtractor 145 receives the number of taps corresponding to the amount of angle delay ANG from the calculation circuit 144, and receives the number of taps ϕDT corresponding to the characteristic of the DCA 131 from the control circuit 4 (see FIG. 1). The subtractor 145 subtracts the number of taps ϕDT corresponding to the characteristic of the DCA 131 from the number of taps corresponding to the amount of angle delay ANG, and supplies a result of the subtraction to the selector 146.

For example, in a case where the number of taps corresponding to the amount of angle delay ANG is "3" and the number of taps ϕDT corresponding to the characteristic of the DCA 131 is "1", which corresponds to the minimum amount of delay of the DCA 131 (see FIG. 4), the subtractor 145 supplies "3−1=2" as a result of the subtraction to the selector 146. At this time, the number of taps "3" is supplied from the calculation circuit 144 to the selector 146. Furthermore, a circuit for clipping the number of taps output from the selector 146 may be provided between the selector 146 and the selectors 147-1 to 147-N. The clipping circuit clips the number of taps output from the selector 146 in such a manner that the number of taps becomes within a range between the minimum number of taps and the maximum number of taps which are physically included in the variable delay circuit 121.

The sequencer 141 generates a control signal ϕDCA indicating whether the selected variable delay circuit 121 corresponds to the delay path which goes through the DCA 131, and then supplies the control signal ϕDCA to the selector 146. For example, in a case where the variable delay circuit 121-S is selected as a target for calculation, the sequencer 141 sets ϕDCA=1, and, in a case where any one of the variable delay circuits 121-1 to 121-(N−1) is selected as a target for calculation, the sequencer 141 sets ϕDCA=0.

If ϕDCA=1, the selector 146 selects the number of taps indicating the result of the subtraction supplied from the subtractor 145, and supplies the selected number of taps to the selectors 147-1 to 147-N. If ϕDCA=0, the selector 146 selects the number of taps supplied from the calculation circuit 144, and supplies the selected number of taps to the selectors 147-1 to 147-N.

Until calculations by the calculation circuit 144 and the subtractor 145 are completed (for example, until the calculation for the number of taps is completed with respect to all or respective of the variable delay circuits 121), the sequencer 141 supplies a control signal ϕCOMP=0 to control terminals of the respective selectors 147-1 to 147-N. If the control signal ϕCOMP=0, the respective selectors 147-1 to 147-N select outputs of the holding circuits 148-1 to 148-N, and supply the selected outputs to input terminals of the respective holding circuits 148-1 to 148-N. The sequencer 141 is able to recognize a calculation progress status which is supplied from the calculation circuit 144 to the selector 146, and upon recognizing a result of calculation performed with respect to the last amount of angle delay ANG[N] being supplied from the calculation circuit 144 to the selector 146, the sequencer 141 determines the calculations by the calculation circuit 144 and the subtractor 145 being completed. In response to the calculations by the calculation circuit 144 and the subtractor 145 being completed (for example, in response to the calculation of the number of taps of all of the variable delay circuits 121 being completed), the sequencer 141 sets a control signal ϕCOMP=1 and supplies the control signal ϕCOMP=1 to the control terminals of the respective selectors 147-1 to 147-N. The respective selectors 147-1 to 147-N supply the numbers of taps supplied from the selector 146 to the holding circuits 148. This causes the latest results of calculation of the number of taps to be sequentially stored in the holding circuits 148-1 to 148-N.

The numbers of taps stored in the holding circuits 148-1 to 148-N are supplied to the respective selectors 149-1 to 149-N. The selectors 149-1 to 149-N receive, at respective control terminals thereof from the interface circuit 7 (see FIG. 1), a select signal ϕIDLE indicating whether the interface circuit 7 is in an idle state (the semiconductor memory 3 is in a ready state). Each of the holding circuits 148-1 to 148-N may be configured with, for example, a flip-flop.

If the select signal ϕIDLE=0, which indicates that the interface circuit 7 is not in an idle state (the semiconductor memory 3 is in a busy state), the respective selectors 149-1 to 149-N select outputs of the application circuits 151-1 to 151-N and then supply the selected outputs to input terminals of the application circuits 151-1 to 151-N. Thus, the results of calculation of the numbers of taps are not applied to the variable delay circuits 121-S to 121-(N−1). Each of the application circuits 151-1 to 151-N may be configured with, for example, a flip-flop.

If the select signal ϕIDLE=1, which indicates that the interface circuit 7 is in an idle state (the semiconductor memory 3 is in a ready state), the respective selectors 149-1 to 149-N select the results of calculation of the numbers of taps supplied from the holding circuits 148-1 to 148-N, and supply the selected results of calculation to the application circuits 151-1 to 151-N. This causes the results of calculation of the numbers of taps to be applied to the variable delay circuits 121-S to 121-(N−1).

For example, in the above-mentioned example in which the number of taps corresponding to the amount of angle delay ANG is "3" and the number of taps ϕDT corresponding to the characteristic of the DCA 131 is "1", which corresponds to the minimum amount of delay of the DCA 131, the result of subtraction indicating the number of taps "2" is set to the variable delay circuit 121-S, and the number of taps "3" is set to each of the other variable delay circuits 121-1 to 121-(N−1).

As described above, in the semiconductor integrated circuit 100, the present embodiment adjusts the amount of delay of a variable delay circuit provided in the delay path PA-S to be smaller than the amounts of delay of variable delay circuits provided in the other delay paths PA-1 to PA-(N−1). This enables preventing or reducing an increase of the circuit size as compared with a case where dummy duty adjustment circuits are provided in the other delay paths PA-1 to PA-(N−1), and also enables equalizing delays of a plurality of delay paths PA-S to PA-(N−1).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a first signal transmission path and a second signal transmission path in parallel with each other;
   a first variable delay circuit provided on the first signal transmission path and configured to cause a first signal to be delayed by a first delay amount;
   a second variable delay circuit provided on the second signal transmission path and configured to cause a second signal to be delayed by a second delay amount; and
   a duty adjustment circuit provided on the first signal transmission path in series with the first variable delay circuit and configured to cause one of a leading edge and a trailing edge of the first signal delayed by the first delay amount to be further delayed by a third delay amount for duty adjustment,
   wherein
   a sum of the first delay amount and the third delay amount is equal to the second delay amount,
   and
   a minimum of the second delay amount delayable by the second variable delay circuit is equal to a minimum of the third delay amount applicable by the duty adjustment circuit.

2. The semiconductor integrated circuit according to claim 1, further comprising a control circuit configured to obtain the first delay amount by subtracting the third delay amount from a predetermined delay amount and control the first variable delay circuit to apply the first delay amount to the first signal.

3. The semiconductor integrated circuit according to claim 2, wherein the control circuit is further configured to obtain the second delay amount according to the predetermined delay amount and control the second variable delay circuit to apply the second delay amount to the second signal.

4. The semiconductor integrated circuit according to claim 2, wherein
   the first variable delay circuit includes:
      a first delay chain including a first plurality of delay elements connected in series; and
      a first selector circuit configured to select a first number of delay elements through which the first signal passes from among the first plurality of elements, and
   the control circuit is further configured to control the first selector circuit to select the first number of delay elements to correspond to the first delay amount.

5. The semiconductor integrated circuit according to claim 4, wherein
   the second variable delay circuit includes:
      a second delay chain including a second plurality of delay elements connected in series; and
      a second selector circuit configured to select a second number of delay elements through which the second signal passes from among the second plurality of elements, and
   the control circuit is further configured to control the second selector circuit to select the second number of delay elements to correspond to the second delay amount.

6. The semiconductor integrated circuit according to claim 4, wherein the control circuit includes a subtraction circuit configured to subtract a number of delay elements corresponding to the third delay amount from a number of delay elements corresponding to the second delay amount, to obtain the number of delay elements corresponding to the first delay amount.

7. The semiconductor integrated circuit according to claim 1, wherein the first signal is a strobe signal and the second signal is a data signal.

8. The semiconductor integrated circuit according to claim 7, further comprising:
   a first flip-flop provided on the first signal transmission path, and having a first clock input node connected to a clock generation circuit, a first data input node configured to receive the strobe signal, and a first output node connected to an input node of the first variable delay circuit; and
   a second flip-flop provided on the second signal transmission path, and having a second clock input node connected to the clock generation circuit, a second data input node configured to receive the data signal, and a second output node connected to an input node of the second variable delay circuit.

9. The semiconductor integrated circuit according to claim 1, wherein no duty adjustment circuit is provided on the second signal transmission path.

10. The semiconductor integrated circuit according to claim 1, further comprising:
    a third signal transmission path in parallel with the first and second signal transmission paths; and
    a third variable delay circuit provided on the third signal transmission path and configured to cause a third signal to be delayed by the second delay amount, wherein the first signal is a strobe signal, and each of the second signal and the third signal is a data signal.

11. The semiconductor integrated circuit according to claim 1, wherein a minimum of the first delay amount delayable by the first variable delay circuit is equal to the minimum of the delay amount applicable to the first signal by the duty adjustment circuit.

12. The semiconductor integrated circuit according to claim 1, wherein the duty adjustment circuit includes a selector configured to select one of the leading edge and the trailing edge to be delayed by the third delay amount for the duty adjustment.

13. A transmission device, comprising:
    a clock generation circuit;
    an interface circuit; and
    a semiconductor integrated circuit connected between the clock generation circuit and the interface circuit, wherein
    the semiconductor integrated circuit includes:
       a first signal transmission path and a second signal transmission path in parallel with each other;
       a first variable delay circuit provided on the first signal transmission path and configured to cause a first signal to be delayed by a first delay amount;
       a second variable delay circuit provided on the second signal transmission path and configured to cause a second signal to be delayed by a second delay amount; and
       a duty adjustment circuit provided on the first signal transmission path in series with the first variable delay circuit and configured to cause one of a leading edge and a trailing edge of the first signal delayed by the first delay amount by the first variable delay circuit to be further delayed by a third delay amount for duty adjustment
    wherein a sum of the first delay amount and the third delay amount is equal to the second delay amount, and a minimum of the second delay amount delayable by the second variable delay circuit is equal to a minimum of the third delay amount applicable by the duty adjustment circuit.

14. The transmission device according to claim 13, wherein the semiconductor integrated circuit further includes a control circuit configured to obtain the first delay amount by subtracting the third delay amount from a predetermined delay amount and control the first variable delay circuit to apply the first delay amount to the first signal.

15. The transmission device according to claim 14, wherein the control circuit is further configured to obtain the second delay amount according to the predetermined delay amount and control the second variable delay circuit to apply the second delay amount to the second signal.

16. The transmission device according to claim 14, wherein
the first variable delay circuit includes:
a first delay chain including a first plurality of delay elements connected in series; and
a first selector circuit configured to select a first number of delay elements through which the first signal passes from among the first plurality of elements, and
the control circuit is further configured to control the first selector circuit to select the first number of delay elements to correspond the first delay amount.

17. The transmission device according to claim 16, wherein
the second variable delay circuit includes:
a second delay chain including a second plurality of delay elements connected in series; and
a second selector circuit configured to select a second number of delay elements through which the second signal passes from among the second plurality of elements, and
the control circuit is further configured to control the second selector circuit to select the second number of delay elements to correspond to the second delay amount.

18. The transmission device according to claim 13, wherein a minimum of the first delay amount delayable by the first variable delay circuit is equal to the minimum of the delay amount applicable to the first signal by the duty adjustment circuit.

19. The semiconductor integrated circuit according to claim 13, wherein the duty adjustment circuit includes a selector configured to select one of the leading edge and the trailing edge to be delayed by the third delay amount for the duty adjustment.

* * * * *